(12) United States Patent
Lee et al.

(10) Patent No.: US 9,351,392 B2
(45) Date of Patent: May 24, 2016

(54) BACKLIGHT ASSEMBLY AND LIQUID CRYSTAL DISPLAY DEVICE USING THE SAME

(71) Applicant: LG Display Co., Ltd., Chicago, IL (US)

(72) Inventors: Sang Dae Lee, Mapo-gu (KR); Kyeong Kun Jang, Namdong-gu (KR); Min Su Cho, Paju-si (KR); Young Mee Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 246 days.

(21) Appl. No.: 13/627,681

(22) Filed: Sep. 26, 2012

(65) Prior Publication Data
US 2013/0258251 A1 Oct. 3, 2013

(30) Foreign Application Priority Data

Mar. 29, 2012 (KR) ........................ 10-2012-0032686

(51) Int. Cl.
*G02F 1/1335* (2006.01)
*H05K 1/02* (2006.01)
*H05K 1/05* (2006.01)
*F21V 8/00* (2006.01)

(52) U.S. Cl.
CPC ............ *H05K 1/0209* (2013.01); *G02B 6/0085* (2013.01); *G02F 1/1336* (2013.01); *G02F 1/133603* (2013.01); *G02B 6/009* (2013.01); *G02B 6/0055* (2013.01); *G02B 6/0088* (2013.01); *G02F 2001/133612* (2013.01); *H05K 1/0284* (2013.01); *H05K 1/056* (2013.01); *H05K 2201/0358* (2013.01); *H05K 2201/10409* (2013.01)

(58) Field of Classification Search
CPC ................... G02F 1/133308; G02F 1/133602; G02F 1/33603; G02F 1/133615; G02F 1/1336; G02B 6/0085; H05K 1/0209

USPC ....................................................... 349/58–69
See application file for complete search history.

(56) References Cited

U.S. PATENT DOCUMENTS

| 8,093,502 | B2 * | 1/2012 | Mikado et al. ................ 361/749 |
| 2009/0045416 | A1 * | 2/2009 | Bierhuizen et al. ............. 257/88 |
| 2010/0007817 | A1 * | 1/2010 | Kim ................................. 349/60 |
| 2011/0007236 | A1 * | 1/2011 | Kim et al. ....................... 349/58 |
| 2014/0070714 | A1 * | 3/2014 | Lee ..................... H05B 33/0818 315/186 |

FOREIGN PATENT DOCUMENTS

| CN | 101017278 A | 8/2007 |
| CN | 102141701 A | 8/2011 |
| CN | 102346332 A | 2/2012 |

OTHER PUBLICATIONS

Office Action and Search Report issued in corresponding Chinese Patent Application No. 201210340111.8, mailed Dec. 2, 2014, 13 pages.

\* cited by examiner

*Primary Examiner* — Dung Nguyen
(74) *Attorney, Agent, or Firm* — Brinks Gilson & Lione

(57) ABSTRACT

A backlight assembly is disclosed that is capable of enabling easy narrow bezel design and easily radiating heat generated from a light source, and a liquid crystal display device using the same. The backlight assembly includes a bottom cover, a light guide plate placed on the bottom cover, a printed circuit board having an L-shaped form and attached to a bottom surface and inner lateral surface of the bottom cover, and a plurality of Light Emitting Diode (LED) packages being mounted to the printed circuit board, wherein the printed circuit board includes a single metal layer having the L-shaped form and attached to the bottom surface and the inner lateral surface of the bottom cover; and a Resin Coated Copper (RCC) film attached to an inner lateral surface of the single metal layer.

22 Claims, 8 Drawing Sheets

BACKLIGHT ASSEMBLY AND LIQUID CRYSTAL DISPLAY DEVICE USING THE SAME

This application claims the priority and the benefit under 35 U.S.C. §119(a) on Korean Patent Application No. P2012-0032686, filed on Mar. 29, 2012, the entire contents of which are hereby incorporated by reference.

BACKGROUND

1. Field of the Invention

The present disclosure relates to a backlight assembly capable of enabling easy narrow bezel design and easily radiating heat generated from a light source, and a liquid crystal display device using the same.

2. Discussion of the Related Art

In recent years, among a variety of display devices, liquid crystal display devices have been used the most owing to characteristics of excellent image quality, light weight, slim profile, and low power consumption. Such liquid crystal display devices require a backlight assembly that emits light to a liquid crystal panel.

A backlight assembly may be classified into a vertical type and an edge type according to the position of a light source. The vertical type backlight assembly is configured such that a light source is located at a rear surface of a liquid crystal panel, and the edge type backlight assembly is configured such that a light source is located at a lateral surface of a liquid crystal panel.

With the recent trend towards a larger size and higher resolution, studies to reduce the volume and weight of a liquid crystal display device have been actively conducted. There is a demand for narrow bezel design.

However, a conventional edge type backlight assembly has a disadvantage due to a heat-radiating pad and an LED housing that are used to radiate heat generated from a light source to the outside. The heat-radiating pad and the LED housing may increase not only the thickness of a bezel region, but also a heat-radiating path, causing deterioration in heat-radiation efficiency.

BRIEF SUMMARY

A backlight assembly includes a bottom cover, a light guide plate placed on the bottom cover, a printed circuit board having an L-shaped form and attached to a bottom surface and an inner lateral surface of the bottom cover, and a plurality of Light Emitting Diode (LED) packages being mounted to the printed circuit board, wherein the printed circuit board includes a single metal layer having the L-shaped form and attached to the bottom surface and the inner lateral surface of the bottom cover, and a Resin Coated Copper (RCC) film attached to an inner lateral surface of the single metal layer.

In accordance with another aspect of the present invention, a backlight assembly includes a bottom cover, a light guide plate placed on the bottom cover, a Light Emitting Diode (LED) housing attached to a bottom surface and an inner lateral surface of the bottom cover to support the light guide plate, and a Resin Coated Copper (RCC) film attached to an inner lateral surface of the LED housing such that a plurality of LED packages is mounted to the RCC film.

In accordance with another aspect of the present invention, a backlight assembly includes a bottom cover, a light guide plate placed on the bottom cover, and a Resin Coated Copper (RCC) film attached to an inner lateral surface of the bottom cover such that a plurality of Light Emitting Diode (LED) packages is mounted to the RCC film.

In accordance with another aspect of the present invention, a backlight assembly includes a bottom cover, a Resin Coated Copper (RCC) film attached to a bottom portion of the bottom cover such that a plurality of Light Emitting Diode (LED) packages is mounted to the RCC film, a diffusive plate to diffuse incident light from the plurality of LED packages, and a plurality of optical sheets stacked on the diffusive plate to vertically direct the light emitted from the diffusive plate.

In accordance with a further aspect of the present invention, a liquid crystal display device includes the backlight assembly according to any one of claims 1 to 16, a liquid crystal panel, a panel guide seated on a rim portion of the bottom cover to support the liquid crystal panel, and a top cover configured to surround a bezel portion of the liquid crystal panel and a lateral portion of the panel guide, the top cover being fastened to the bottom cover.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE DRAWINGS AND THE PRESENTLY PREFERRED EMBODIMENTS

Reference will now be made in detail to a backlight assembly according to the exemplary embodiments of the present invention, examples of which are illustrated in the accompanying drawings.

First Embodiment

Figure 1:
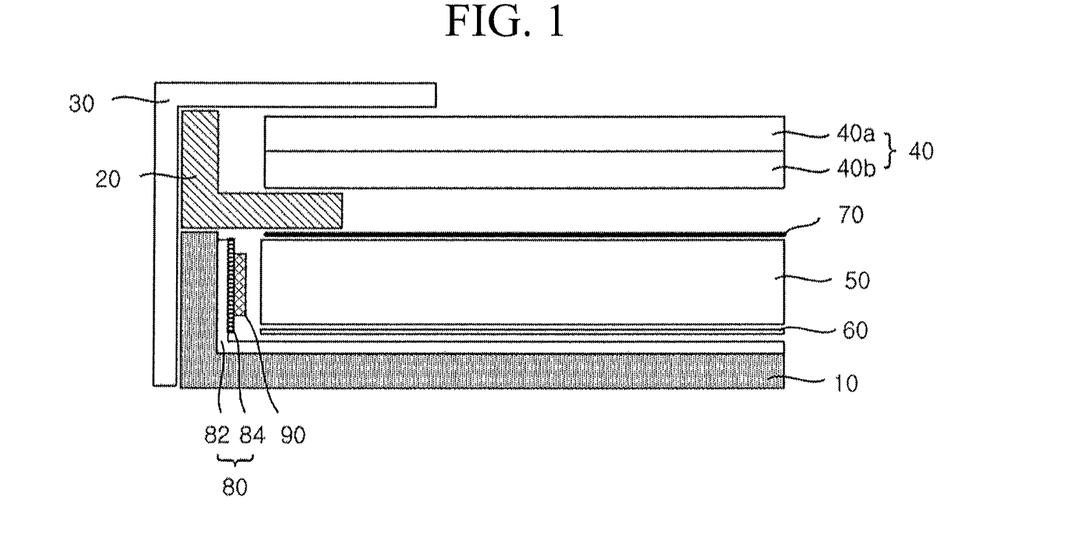
FIG. 1 is a sectional view showing a liquid crystal display device including a backlight assembly according to a first embodiment of the present invention.

FIG. 1 is a sectional view showing a liquid crystal display device including a backlight assembly according to a first embodiment of the present invention.

The liquid crystal display shown in FIG. 1 includes a bottom cover 10, a light guide plate 50 placed over the bottom cover 10, and an L-shaped printed circuit board 80 attached to a bottom surface and inner lateral surface of the bottom cover 10 such that a plurality of Light Emitting Diode (LED) packages 90 is mounted to the printed circuit board 80. A liquid crystal display device includes the backlight assembly, a panel guide 20 seated on a lateral rim portion of the bottom cover 10 to support a liquid crystal panel 40, and a top cover 30 configured to surround the panel guide 20 and the liquid crystal panel 40 and coupled to the bottom cover 10.

The backlight assembly further includes a reflecting plate 60 placed between a bottom portion of the printed circuit board 80 and the light guide plate 50, and a plurality of optical sheets 70 stacked on the light guide plate 50.

In the first embodiment, the printed circuit board 80 includes a single metal layer 82 having an L-shaped form and attached to the bottom surface and the inner lateral surface of the bottom cover 10, and a Resin Coated Copper (RCC) film 84 attached to an inner lateral surface of the single metal layer 82.

The RCC film 84 basically includes an insulating layer 86, and a copper pattern layer 88 formed on the insulating layer 86 and connected to the plurality of LED packages 90. In this case, the insulating layer 86 may be formed of epoxy-based materials, or polyimide-based materials. In the case of the insulating layer 86 formed of epoxy-based materials, the RCC film 84 may be formed into two layers including the insulating layer 86 and the copper pattern layer 88 on the insulating layer 86. In the case of the insulating layer 86 formed of polyimide-based materials, the RCC film 84 may be formed into three or four layers including the insulating layer 86 and an adhesive layer (not shown) above and/or below the insulating layer 86. Meanwhile, the insulating layer 86 may selectively contain an inorganic filler for enhanced thermal conductivity.

The bottom cover 10 and the top cover 30 constitute a case of the liquid crystal display device, in which the liquid crystal panel 40 and other components of the backlight assembly are accommodated. In this case, the liquid crystal panel 40 is composed of two glass substrates, i.e. an upper substrate 40a and a lower substrate 40b, and a liquid crystal layer (not shown) is interposed between the upper substrate 40a and the lower substrate 40b.

The light guide plate 50 serves to guide incident light from the plurality of LED packages 90 to change linear light into planar light. The light guide plate 50 may be formed of Poly-MethylMethAcrylate (PMMA) having excellent total reflectance.

The plurality of optical sheets 70 takes charge of diffusion and collection of incident light from the light guide plate 50. The plurality of optical sheets 70 may include at least one diffusive sheet and at least one condensing sheet to collect light for enhanced light emission efficiency.

The panel guide 20 is configured to support the liquid crystal panel 40. To this end, the panel guide 20 includes a body portion placed on the bottom cover 10 and a stepped portion to support the liquid crystal panel 40.

The plurality of LED packages 90 is mounted to the lateral portion of the printed circuit board 80. The printed circuit board 80 also serves to radiate heat generated from the plurality of LED packages 90 to the outside. Since the bottom portion of the printed circuit board 80 is formed of the single metal layer 82, the printed circuit board 80 may exhibit excellent heat radiation. Although the printed circuit board 80 is constructed based on a conventional Metal Core Printed Circuit Board (MCPCB), there is a difference in that the bottom portion is formed of the single Metal layer 82. The MCPCB will hereinafter be described for reference.

Figure 2A:
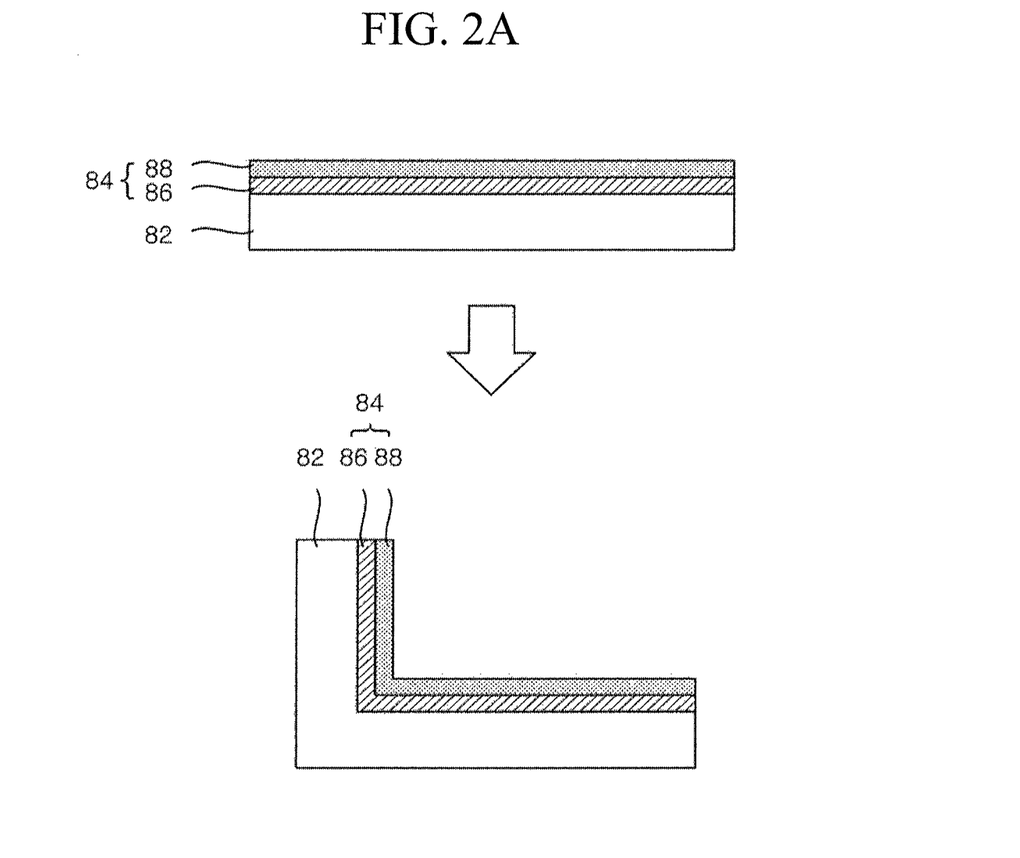
FIGS. 2A and 2B are views comparing a conventional printed circuit board with a printed circuit board according to an embodiment of the present invention.
Figure 2B:
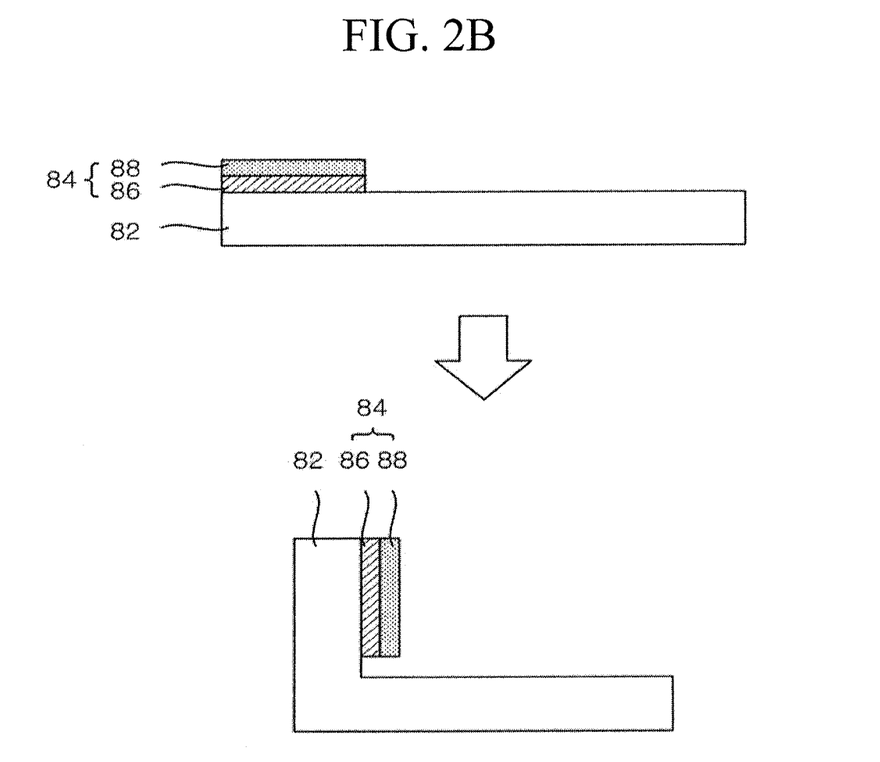

FIGS. 2A and 2B are views comparing a conventional printed circuit board with a printed circuit board according to the present invention. FIG. 2A is a sectional view showing a conventional MCPCB, and FIG. 2B is a sectional view showing the printed circuit board of the present invention.

Referring to FIG. 2A, the conventional MCPCB is fabricated using a copper clad laminate (hereinafter, referred to as an MCCL) as a raw material. More specifically, the MCCP includes a base layer 82 formed of aluminum, copper, or copper alloys, a thermally conductive resin layer 86 formed on the base layer 82, and a copper layer 88 formed on the thermally conductive resin layer 86. In this case, the thermally conductive resin layer 86 and the copper layer 88 take the form of a so-called RCC film and are laminated onto the base layer. When fabricating an L-shaped MCPCB using the MCCL, the base layer forms the metal layer 82, and the thermally conductive resin layer and copper layer form the above described RCC film 84. However, in case of fabricating the L-shaped MCPCB using the MCCL, the RCC film 84 is formed on the bottom portion as well as the lateral portion of the printed circuit board 80 to which the LED packages 90 are mounted, which may deteriorate thermal conductivity of the printed circuit board 80. That is, since the thermally conductive resin layer 86 constituting the RCC film 84 has much lower thermal conductivity than the metal layer 82, stacking the RCC film 84 even on the bottom portion of the printed circuit board 80 may prevent radiation of heat generated from the LED packages 90. In this case, the reason why the MCPCB is configured into an L-shaped form is to omit an LED housing and heat-radiating pad, and also to realize enhanced heat-radiation and easy narrow bezel design.

To solve the above described problems, according to the first embodiment, as shown in FIG. 2B, the printed circuit board 80 takes the form of an L-shaped form, and the RCC film 84 is laminated only to the lateral portion of the printed circuit board 80, to enhance heat-radiation. Meanwhile, in addition to enhanced heat-radiation, the first embodiment may achieve reduction in cost owing to omission of the RCC film 84 on the bottom portion of the printed circuit board 80. In actuality, the RCC film 84 is a factor increasing the manufacturing costs of the MCPCB. In the L-shaped MCPCB, the area of the bottom portion is greater than the area of the lateral portion. Thus, according to the first embodiment, the costs of the RCC film 84 may be reduced as much as the area of the bottom portion, which results in considerable cost reduction.

As described above, in the first embodiment, the L-shaped printed circuit board 80 may substitute for an LED housing and heat-radiating pad, which results in enhanced heat radiation and easy narrow bezel design. Moreover, attaching the RCC film 84 only to the lateral portion of the printed circuit board 80 may further enhance heat radiation.

Second Embodiment

Figure 3:
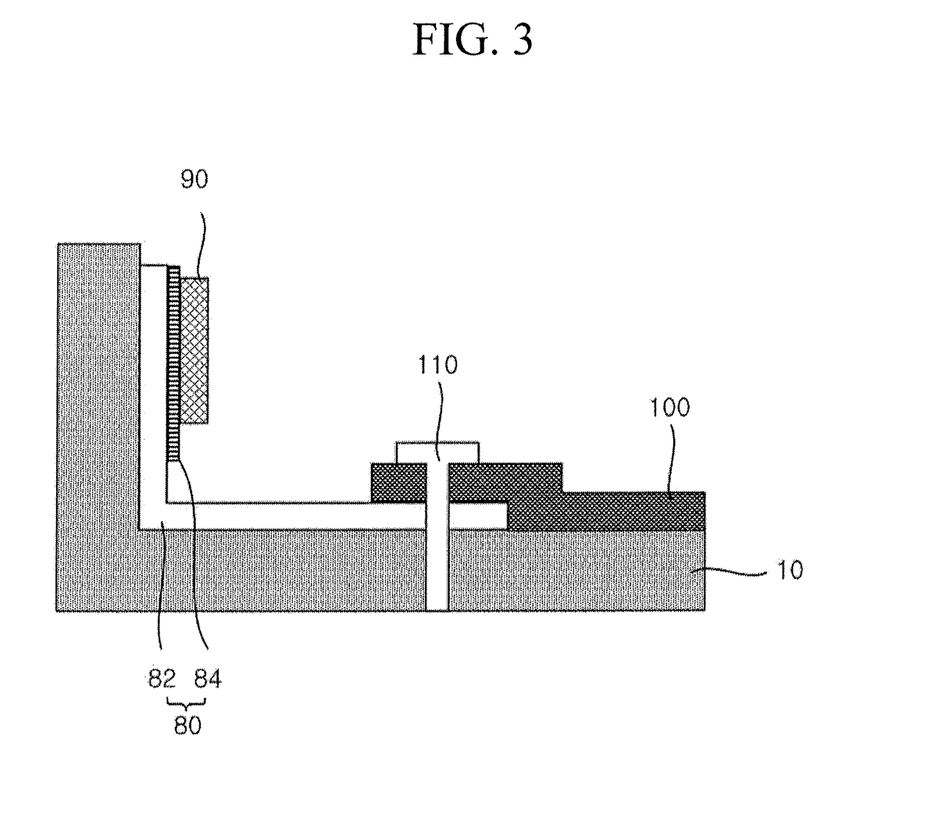
FIG. 3 is a sectional view showing a backlight assembly according to a second embodiment of the present invention.

FIG. 3 is a sectional view showing a backlight assembly according to a second embodiment of the present invention.

Differently from the first embodiment, the second embodiment has a feature that the backlight assembly further includes a dummy housing 100. Thus, a description of the other configurations of the second embodiment except for the dummy housing 100 will be replaced by the above description of the first embodiment.

In the first embodiment, although easy narrow bezel design can be realized as a result of omitting an LED housing from a conventional backlight assembly, omission of the LED housing may cause deteriorated fastening force at a screw fastening structure between the printed circuit board 80 and the bottom cover 10. To solve this problem, the second embodiment further employs the dummy housing 100. The dummy housing 100 serves to alleviate reduction in fastening force due to a reduced thickness of the bottom portion of the backlight assembly according to the first embodiment.

More specifically, the dummy housing 100 is configured to cover the bottom portion of the printed circuit board 80 and the bottom cover 10. The dummy housing 100 is secured to the printed circuit board 80 via a screw 110. The screw 110 penetrates through the dummy housing 100, the bottom portion of the printed circuit board 80, and the bottom cover 10.

As described above, according to the second embodiment, the printed circuit board 80 achieves enhanced fastening strength, which may enhance the reliability of a backlight assembly product.

Figure 4:
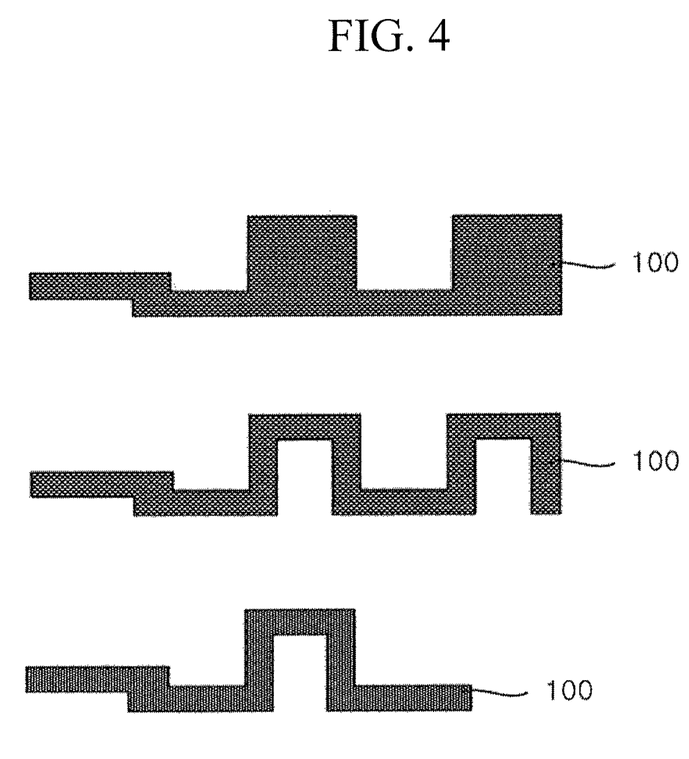
FIG. 4 is a view showing various alternative embodiments of a dummy housing.

Meanwhile, the dummy housing 100 may serve to support the light guide plate 50 and to increase heat radiation, in addition to providing enhanced fastening strength. That is, the dummy housing 100, as shown in FIG. 4, may include at least one protrusion to support the light guide plate 50. In this case, the protrusion may be provided at a rear surface thereof with recesses, although the number and shape of the recesses are not limited. Also, the dummy housing 100 may be formed of aluminum, Electrolytic Galvanized Iron (EGI), or reinforced plastics. If the dummy housing 100 is formed of high thermal conductivity aluminum, further enhanced heat radiation may be expected.

Third Embodiment

Figure 5:
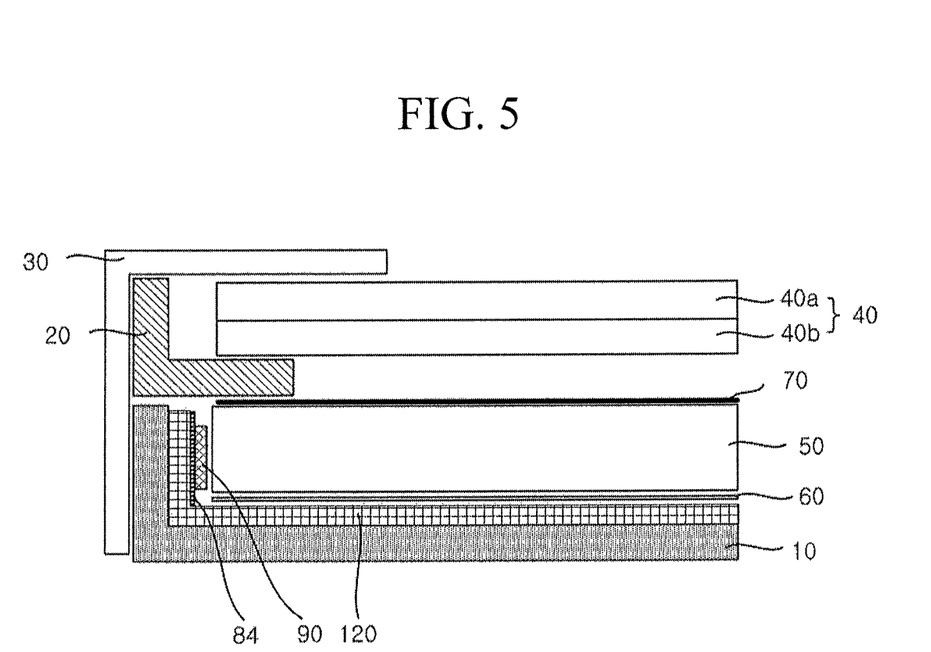
FIG. 5 is a sectional view showing a liquid crystal display device including a backlight assembly according to a third embodiment of the present invention.

FIG. 5 is a sectional view showing a liquid crystal display device including a backlight assembly according to a third embodiment of the present invention.

Differently from the first embodiment, instead of the single metal layer 82, an LED housing 120 is used. The third embodiment has a feature that the RCC film 84 and the plurality of LED packages 90 are attached to an inner lateral surface of the LED housing 120. That is, in the third embodiment, the RCC film 84 is directly laminated to the inner lateral surface of the LED housing 120 without a heat-radiating pad or metal layer interposed therebetween, and the plurality of LED packages 90 is mounted to the RCC film 84. The third embodiment having the above described configuration may achieve enhanced heat radiation owing to a shortened heat radiation path as well as enhanced assembly efficiency and less generation of defective products owing to omission of the heat radiating pad.

Fourth Embodiment

Figure 6:
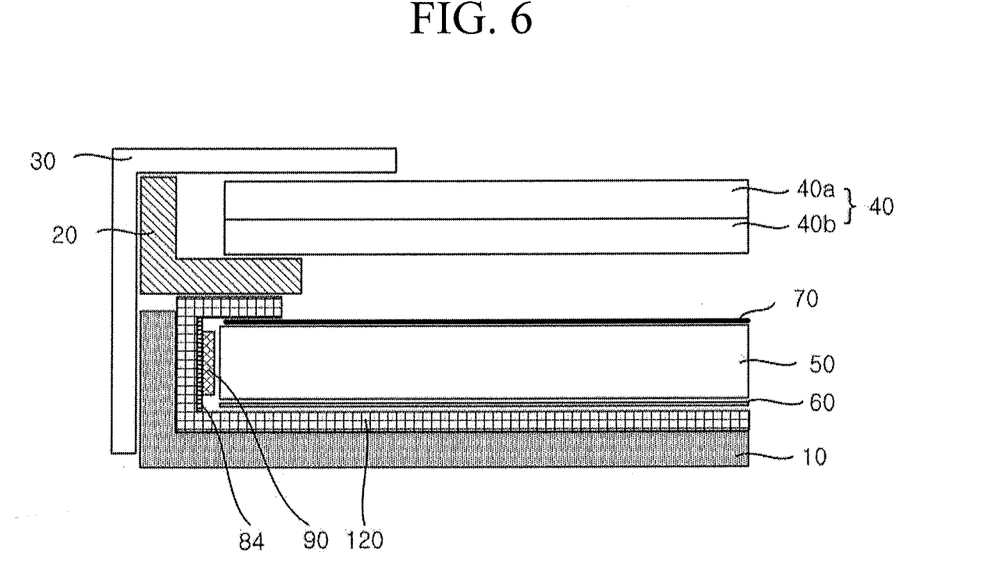
FIG. 6 is a sectional view showing a liquid crystal display device including a backlight assembly according to a fourth embodiment of the present invention.

FIG. 6 is a sectional view showing a liquid crystal display device including a backlight assembly according to a fourth embodiment of the present invention.

The fourth embodiment has a feature that the LED housing 120 has a U-shaped form differently from the third embodiment.

More specifically, the LED housing 120 includes a first face attached to the bottom surface of the bottom cover 10, a second face bent from the first face, to which the RCC film 84 is attached, and a third face extending from the second face toward the liquid crystal panel 40.

For reference, a light introducing portion of the light guide plate 50 exhibits uneven brightness, and thus hot spots. In the fourth embodiment, the third face of the LED housing 120 is provided on an upper region of the light guide plate 50 adjacent to the LED packages 90, which may provide the light introducing portion of the light guide plate 50 with even brightness. In the fourth embodiment, a reflector, such as a reflecting sheet, may be attached to the rear of the third face of the LED housing 120, or the third face of the LED housing 120 may be subjected to appropriate surface treatment, to prevent light emitted from the upper surface of the light guide plate 50 from being absorbed by the panel guide 20.

Fifth Embodiment

Figure 7:
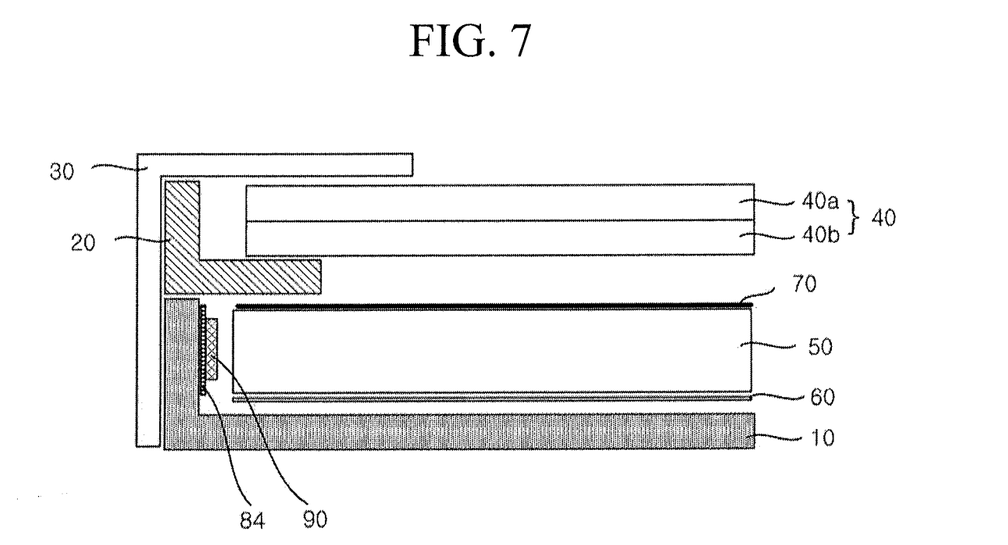
FIG. 7 is a sectional view showing a liquid crystal display device including a backlight assembly according to a fifth embodiment of the present invention.

FIG. 7 is a sectional view showing a liquid crystal display device including a backlight assembly according to a fifth embodiment of the present invention.

The fifth embodiment has a feature that the RCC film 84 and the plurality of LED packages 90 are attached to the inner lateral surface of the bottom cover 10, differently from the first embodiment. That is, in the fifth embodiment, none of an LED housing, heat-radiating pad, and metal layer is present, and the RCC film 84 is directly laminated to the inner lateral surface of the bottom cover 10 such that the plurality of LED packages 90 is mounted to the RCC film 84. In this way, the fifth embodiment may minimize the thickness of a bezel region, and achieve a simplified configuration, and consequently enhanced assembly performance. The backlight assembly according to the fifth embodiment is preferably applied to a liquid crystal display device having a relatively small size.

Sixth Embodiment

Figure 8:
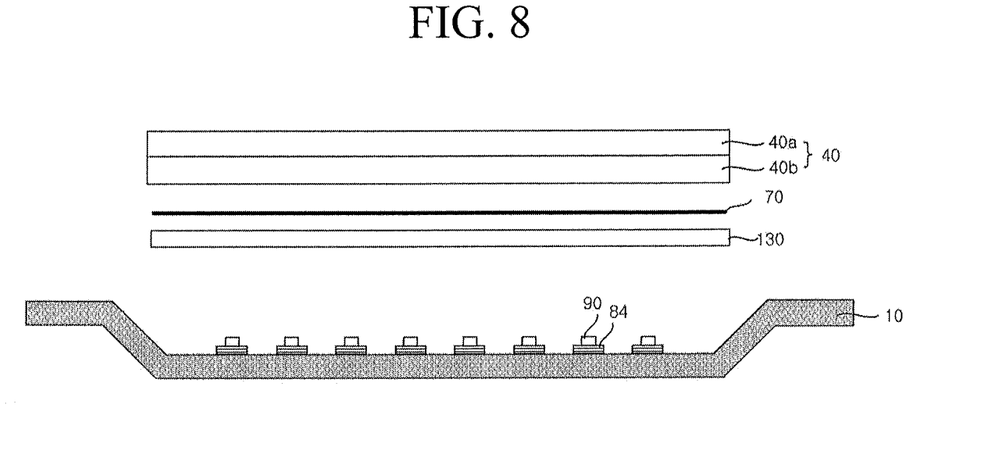
FIG. 8 is a sectional view showing a backlight assembly according to a sixth embodiment of the present invention.
Figure 9:
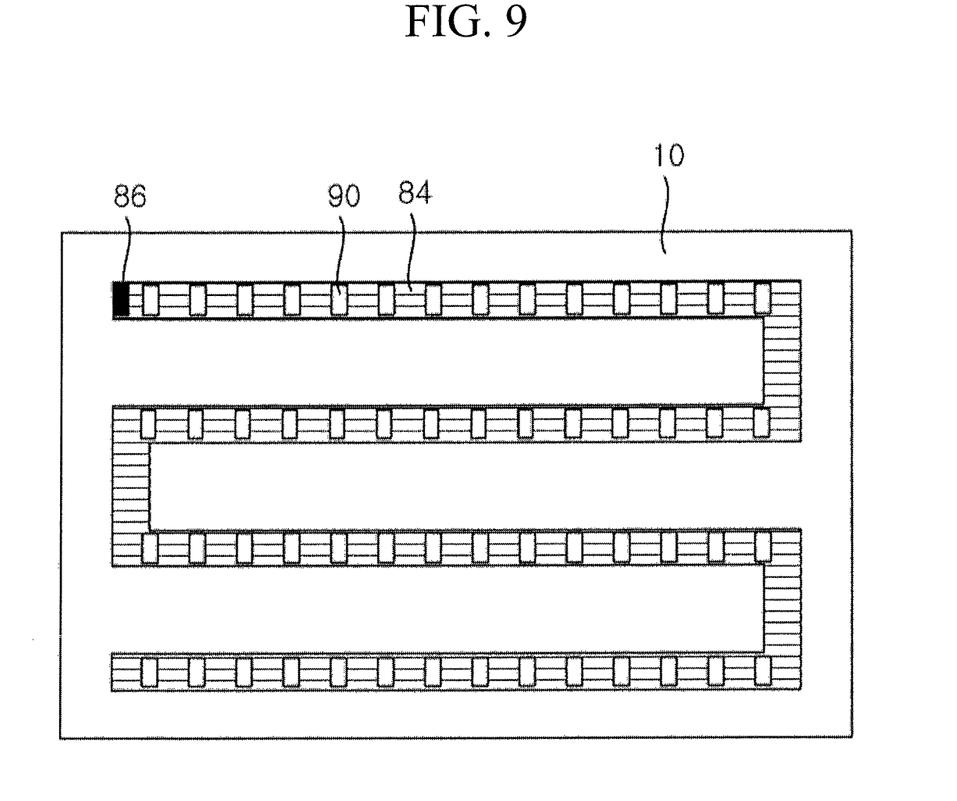
FIG. 9 is a plan view of the backlight assembly shown in FIG. 8.

FIG. 8 is a sectional view showing a backlight assembly according to a sixth embodiment of the present invention, and FIG. 9 is a plan view of the backlight assembly shown in FIG. 8.

The sixth embodiment has a feature that the position of a light source is of a vertical type, although the RCC film 84 is directly attached to the bottom cover 10 similar to the fifth embodiment.

Referring to FIG. 8, the backlight assembly according to the sixth embodiment includes the bottom cover 10, the RCC film 84 attached to the bottom cover 10 such that the plurality of LED packages 90 is mounted to the RCC film 94, a diffusive plate 130 to diffuse incident light from the plurality of LED packages 90, and the plurality of optical sheets 70 stacked on the diffusive plate 130.

Meanwhile, a reflecting plate (not shown) may further be provided between the plurality of LED packages 90 and the bottom cover 10, to upwardly reflect light directed from the LED packages 90 located thereabove.

The diffusive plate 130 directs incident light from the LED packages 90 forward of the liquid crystal panel 40, and ensures even light distribution over a wide range. The diffusive plate 130 may be formed by coating both surfaces of a transparent resin film with a light diffusive material, or may be formed of an opaque resin mixed with a diffusive material.

The plurality of optical sheets 70 serves to vertically direct light emitted from the diffusive plate 130, achieving light emission efficiency.

The RCC film 84, as shown in FIG. 9, has a "ㄹ"-shaped form. That is, the RCC film 84 extends from one side to the other side of the bottom cover 10, and then from the other side to one side of the bottom cover 10, thereby forming a ㄹ-shaped structure.

In the sixth embodiment, owing to the vertical type light source and omission of the printed circuit board, heat generated from the LED packages 90 is directly transferred through the bottom cover 10 without an adhesive tape, which results in enhanced heat radiation. Moreover, the ⊇-shaped arrangement of the RCC film 84 enables use of a single connector that is used to drive the LED packages 90, resulting in enhanced assembly efficiency and productivity.

As is apparent from the above description, according to the present invention, by selectively attaching or forming the RCC film and the LED packages onto the metal layer, LED housing, or bottom cover, it is possible to achieve enhanced heat radiation, easy narrow bezel design, reduced costs, and enhanced assembly efficiency and productivity.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A backlight assembly comprising:
   a bottom cover;
   a light guide plate on the bottom cover and supported by the bottom cover;
   a printed circuit board including a single metal layer and a Resin Coated Copper (RCC) film, the single metal layer attached to the bottom cover and including an inner lateral surface and a bottom surface, and the Resin Coated Copper (RCC) film attached to only the inner lateral surface of the single metal layer; and
   a plurality of Light Emitting Diode (LED) packages placed between the printed circuit board and a lateral surface of the light guide plate, and mounted to the RCC film,
   wherein the RCC film includes an insulating layer attached to the single metal layer, and a copper pattern layer disposed on the insulating layer and connected to the plurality of LED packages.

2. The backlight assembly according to claim 1, wherein the single metal layer is formed of a material selected from the group consisting of aluminum, copper, or copper alloys.

3. The backlight assembly according to claim 1,
   wherein the insulating layer is formed of an epoxy-based material.

4. The backlight assembly according to claim 1,
   wherein the insulating layer is formed of a polyimide-based material,
   wherein the RCC film further includes an adhesive layer formed at least one of above and below the insulating layer.

5. A backlight assembly comprising:
   a bottom cover;
   a light guide plate on the bottom cover;
   a printed circuit board attached to the bottom cover, wherein the printed circuit board includes: a single metal layer including an inner lateral surface and a bottom surface and the single metal layer attached to the bottom cover; and a Resin Coated Copper (RCC) film attached to only the inner lateral surface of the single metal layer; and
   a plurality of Light Emitting Diode (LED) packages facing with a lateral surface of the light guide plate and the plurality of LED packages placed on the RCC film,
   a dummy housing configured to cover the bottom surface of the single metal layer and the bottom cover; and
   a screw fastened through the dummy housing, the bottom surface of the single metal layer, and the bottom cover.

6. The backlight assembly according to claim 5, wherein the dummy housing is formed of a material selected from the group consisting of aluminum, Electrolytic Galvanized Iron (EGI), or reinforced plastics.

7. The backlight assembly according to claim 5, wherein the dummy housing has at least one protrusion to support the light guide plate.

8. A backlight assembly comprising:
   a bottom cover;
   a light guide plate on the bottom cover and supported by the bottom cover;
   a Light Emitting Diode (LED) housing attached to the bottom cover and including first and second surfaces, the first surface facing with a bottom surface of the bottom cover, and the second surface facing with an inner lateral surface of the bottom cover;
   a RCC film is attached to only the second surface of the LED housing; and
   a plurality of LED packages placed between the LED housing and a lateral surface of the light guide plate, and mounted to the Resin Coated Copper (RCC) film,
   wherein the RCC film includes an insulating layer attached to only the second surface of the LED housing, and a copper pattern layer disposed on the insulating layer and connected to the plurality of LED packages.

9. The backlight assembly according to claim 8, wherein the LED housing further includes:
   a third surface extending inward from the second face,
   wherein the second surface bent from the first surface.

10. The backlight assembly according to claim 8,
    wherein the insulating layer is formed of an epoxy-based material.

11. The backlight assembly according to claim 8,
    wherein the insulating layer is formed of a polyimide-based material,
    wherein the RCC film further includes an adhesive layer formed at least one of above and below the insulating layer.

12. A backlight assembly comprising:
    a bottom cover;
    a light guide plate on the bottom cover and supported by the bottom cover;
    a RCC film directly attached to only an inner lateral surface of the bottom cover; and
    a plurality of LED packages placed between the bottom cover and a lateral surface of the light guide plate, and mounted to the Resin Coated Copper (RCC) film,
    wherein the RCC film includes an insulating layer attached to the inner lateral surface of the bottom cover, and a copper pattern layer on the insulating layer and connected to the plurality of LED packages.

13. A backlight assembly comprising:
    a bottom cover;
    a light guide plate above the bottom cover and supported by the bottom cover;
    a RCC film directly attached to only a bottom surface of the bottom cover;
    a plurality of LED packages placed between the bottom surface of the bottom cover and a bottom surface of the light guide plate, and mounted to the Resin Coated Copper (RCC) film;
    a diffusive plate above the light guide plate and diffusing incident light from the plurality of LED packages; and
    a plurality of optical sheets stacked on the diffusive plate to vertically direct the light emitted from the diffusive plate, wherein the RCC film includes an insulating layer attached to the bottom surface of the bottom cover, and a copper pattern layer disposed on the insulating layer and connected to the plurality of LED packages.

14. The backlight assembly according to claim 13, wherein the insulating layer is formed of an epoxy-based material.

15. The backlight assembly according to claim 13,
wherein the insulating layer is formed of a polyimide-based material,
wherein the RCC film further includes an adhesive layer formed at least one of above and below the insulating layer.

16. A liquid crystal display device comprising:
a backlight assembly comprising a bottom cover;
a panel guide seated on a lateral rim portion of the bottom cover;
a liquid crystal panel supported by the panel guide; and
a top cover coupled to the bottom cover such that the top cover and the bottom cover surround the backlight assembly, the panel guide and the liquid crystal panel,
wherein the backlight assembly further comprises:
a light guide plate on the bottom cover and supported by the bottom cover;
a single metal layer attached to the bottom cover and including an inner lateral surface and a bottom surface;
a Resin Coated Copper (RCC) film attached to only the inner surface of the single metal layer; and
a plurality of Light Emitting Diode (LED) packages mounted to the RCC film such that the plurality of LED packages and the RCC film are placed between the single metal layer and a lateral surface of the light guide plate,
wherein the RCC film includes an insulating layer attached to only the single metal layer and a copper pattern layer disposed on the insulating layer and connected to the plurality of LED packages.

17. A liquid crystal display device comprising:
a backlight assembly comprising a bottom cover;
a panel guide seated on a lateral rim portion of the bottom cover;
a liquid crystal panel supported by the panel guide; and
a top cover coupled to the bottom cover such that the top cover and the bottom cover surround the backlight assembly, the panel guide and the liquid crystal panel,
wherein the backlight assembly further comprises:
a light guide plate on the bottom cover and supported by the bottom cover;
a single metal layer attached to the bottom cover and including an inner lateral surface and a bottom surface;
a Resin Coated Copper (RCC) film attached to only the inner surface of the single metal layer;
a plurality of Light Emitting Diode (LED) packages mounted to the RCC film such that the plurality of LED packages and the RCC film are placed between the single metal layer and a lateral surface of the light guide plate;
a dummy housing configured to cover the bottom surface of the single metal layer and the bottom cover; and
a screw fastened through the dummy housing, the bottom surface of the single metal layer, and the bottom cover,
wherein the RCC film includes an insulating layer attached to only the single metal layer and a copper pattern layer on the insulating layer and connected to the plurality of LED packages.

18. The liquid crystal display device according to claim 17,
wherein the dummy housing is formed of a material selected from the group consisting of aluminum, Electrolytic Galvanized Iron (EGI), or reinforced plastics, and
wherein the dummy housing has at least one protrusion to support the light guide plate.

19. A liquid crystal display device comprising:
a backlight assembly comprising a bottom cover;
a panel guide seated on a lateral rim portion of the bottom cover;
a liquid crystal panel supported by the panel guide; and
a top cover coupled to the bottom cover such that the top cover and the bottom cover surround the backlight assembly, the panel guide and the liquid crystal panel,
wherein the backlight assembly further comprises:
a light guide plate on the bottom cover and supported by the bottom cover;
a Light Emitting Diode (LED) housing attached to the bottom cover and including first and second surfaces, the first surface facing with a bottom surface of the bottom cover, and the second surface facing with an inner lateral surface of the bottom cover;
a Resin Coated Copper (RCC) film attached to only the second surface of the LED housing; and
a plurality of Light Emitting Diode (LED) packages mounted to the RCC film such that the plurality of LED packages and the RCC film are placed between the LED housing and a lateral surface of the light guide plate,
wherein the RCC film includes an insulating layer attached to only the second surface of the LED housing, and a copper pattern layer disposed on the insulating layer and connected to the plurality of LED packages.

20. The liquid crystal display device according to claim 19, wherein the LED housing further includes:
a third surface extending inward from the second face,
wherein the second surface bent from the first surface.

21. A liquid crystal display device comprising:
a backlight assembly comprising a bottom cover;
a panel guide seated on a lateral rim portion of the bottom cover;
a liquid crystal panel supported by the panel guide; and
a top cover coupled to the bottom cover such that the top cover and the bottom cover surround the backlight assembly, the panel guide and the liquid crystal panel,
wherein the backlight assembly further comprises:
a light guide plate on the bottom cover and supported by the bottom cover;
a Resin Coated Copper (RCC) film directly attached to only an inner lateral surface of the bottom cover; and
a plurality of Light Emitting Diode (LED) packages mounted to the RCC film such that the plurality of LED packages and the RCC film are placed between the bottom cover and a lateral surface of the light guide plate,
wherein the RCC film includes an insulating layer attached to only the inner lateral surface of the bottom cover, and a copper pattern layer disposed on the insulating layer and connected to the plurality of LED packages.

22. A liquid crystal display device comprising:
a backlight assembly comprising a bottom cover;
a panel guide seated on a lateral rim portion of the bottom cover;
a liquid crystal panel supported by the panel guide; and
a top cover coupled to the bottom cover such that the top cover and the bottom cover surround the backlight assembly, the panel guide and the liquid crystal panel, wherein the backlight assembly further comprises:

a light guide plate on the bottom cover and supported by the bottom cover;

a Resin Coated Copper (RCC) film directly attached to only an bottom surface of the bottom cover;

a plurality of Light Emitting Diode (LED) packages mounted to the RCC film such that the plurality of LED packages and the RCC film are placed between the bottom cover and a bottom surface of the light guide plate;

a diffusive plate above the light guide plate and diffusing incident light from the plurality of LED packages; and a plurality of optical sheets stacked on the diffusive plate to vertically direct the light emitted from the diffusive plate, wherein the RCC film includes an insulating layer attached to only the bottom surface of the bottom cover, and a copper pattern layer disposed on the insulating layer and connected to the plurality of LED packages.

* * * * *